US011565593B2

(12) United States Patent
Steck et al.

(10) Patent No.: US 11,565,593 B2
(45) Date of Patent: Jan. 31, 2023

(54) HOLDING APPARATUS FOR CURRENT AND SIGNAL CONDUCTORS OF A TRACTION BATTERY OF A MOTOR VEHICLE

(71) Applicant: Dr. Ing. h.c. F. Porsche Aktiengesellschaft, Stuttgart (DE)

(72) Inventors: Armin Steck, Renningen (DE); Felix Brendecke, Leonberg (DE)

(73) Assignee: Dr. Ing. h. c. F Porsche AG, Stuttgart (DE)

(*) Notice: Subject to any disclaimer, the term of this patent is extended or adjusted under 35 U.S.C. 154(b) by 301 days.

(21) Appl. No.: 16/822,236

(22) Filed: Mar. 18, 2020

(65) Prior Publication Data

US 2020/0298712 A1  Sep. 24, 2020

(30) Foreign Application Priority Data

Mar. 18, 2019 (DE) ...................... 10 2019 106 790.1

(51) Int. Cl.
*B60K 1/04* (2019.01)
*B60L 50/64* (2019.01)
(Continued)

(52) U.S. Cl.
CPC ............. *B60L 50/64* (2019.02); *H01M 50/20* (2021.01); *H01M 50/502* (2021.01); *H05K 9/0098* (2013.01); *H01M 2220/20* (2013.01)

(58) Field of Classification Search
CPC ...... B60L 50/64; B60L 50/66; B60Y 2200/91; B60Y 2200/92; H02G 3/32; H02G 5/02;
(Continued)

(56) References Cited

U.S. PATENT DOCUMENTS 8,079,435 B2    12/2011  Takasaki et al.
9,490,460 B2 *  11/2016  Yanagi ................ H01M 10/613
(Continued)

FOREIGN PATENT DOCUMENTS

JP   2013-125612     6/2013
JP   2015-182655  * 10/2015  ............... B60K 1/04
KR   101278229       6/2013

OTHER PUBLICATIONS

Gennan Examination Report dated Sep. 22, 2020.

*Primary Examiner* — Michael L Dignan
(74) *Attorney, Agent, or Firm* — Gerald E. Hespos; Michael J. Porco

(57) ABSTRACT

A holding apparatus (15) for current and signal conductors of a traction battery of a motor vehicle has a plate-like base body with longitudinal sides (16), transverse ends (17) and a top (18) and bottom (19) extending between the longitudinal sides (16) and transverse ends (17). Elements (20) are arranged on the top (18) and the bottom (19) for guiding and fixing current conductors (12) of the traction battery, and elements (21) are arranged on the other of the top (18) and the bottom (19) for guiding and fixing at least one signal conductor (14) of the traction battery. The base body provides EMC shielding of the signal conductor (14) from the current conductors (12). The plate-like base body has on the opposite longitudinal sides (16) and/or on the opposite transverse sides (17) sections (22) for securing and grounding the holding apparatus on a frame of the motor vehicle.

10 Claims, 2 Drawing Sheets

(51) Int. Cl.
*H01M 50/20* (2021.01)
*H01M 50/502* (2021.01)
*H05K 9/00* (2006.01)

(58) Field of Classification Search
CPC ........ H02G 5/06; H02G 5/025; H05K 9/0098;
H01M 50/20; H01M 50/502; H01M
2220/20
See application file for complete search history.

(56) References Cited

U.S. PATENT DOCUMENTS

| 2010/0025078 A1* | 2/2010 | Wagener | H02G 5/025 |
| | | | 174/168 |
| 2016/0336688 A1* | 11/2016 | Yanli | H01R 25/142 |
| 2016/0351298 A1* | 12/2016 | Gundel | H05K 9/0098 |
| 2018/0013273 A1* | 1/2018 | Omura | H02G 3/0406 |
| 2018/0105209 A1* | 4/2018 | Fees | B60L 50/66 |
| 2018/0337374 A1* | 11/2018 | Matecki | B60K 1/04 |
| 2019/0217794 A1* | 7/2019 | Chandra | B60R 16/03 |
| 2019/0245185 A1 | 8/2019 | Ishihara | |

* cited by examiner

HOLDING APPARATUS FOR CURRENT AND SIGNAL CONDUCTORS OF A TRACTION BATTERY OF A MOTOR VEHICLE

CROSS REFERENCE TO RELATED APPLICATION

This application claims priority under 35 USC 119 to German Patent Appl. No. 10 2019 130 854.2 filed on Mar. 18, 2019, the entire disclosure of which is incorporated herein by reference.

BACKGROUND

Field of the Invention

The invention relates to a holding apparatus for current and signal conductors of a traction battery of a motor vehicle.

Related Art

Traction batteries are installed in electric vehicles and hybrid vehicles. Such traction batteries have a multiplicity of battery modules that are interconnected electrically with one another, and each battery module has a multiplicity of battery cells that are interconnected electrically with one another. Current conductors and signal conductors interconnect the battery modules of a traction battery. The current conductors may be busbars to transmit electrical energy from the traction battery in the direction of an electric machine of the motor vehicle. The busbars also transmit electrical energy from the electric machines in the direction of the traction battery during generator operation of the electric machine. The signals conductors transmit communication signals to provide voltage information and temperature information about the battery modules for control and regulation purposes.

The electric currents transmitted by the current conductors may cause undesired electrical or electromagnetic effects that adversely affect the transmission of communication signals via the signal conductors. Therefore, the signal conductors typically are placed a great distance from the current conductors. However, sufficient physical separation of current conductors and signal conductors is not possible in all areas of a motor vehicle. In this case, shielded signal conductors help, but the shielding of the signal conductor must be grounded. To this end, the shielding of each signal conductor must be contact-connected to a ground potential. This is complex and susceptible to faults.

A need exists for a holding apparatus for current and signal conductors of a traction battery of a motor vehicle that provides good shielding between the current conductors and at least one signal conductor using simple means in the case of a small distance between the current conductors and the signal conductor. It is therefore an object of the invention to provide such a holding apparatus.

SUMMARY

The invention relates to holding apparatus with a plate-like base body that has longitudinal sides, transverse sides and also a top and bottom extending between the longitudinal sides and transverse sides.

Elements are arranged on one of the top and the bottom for guiding and fixing current conductors of the traction battery.

Elements also may be arranged on the other of the top and the bottom for guiding and fixing at least one signal conductor of the traction battery.

The plate-like base body provides EMC shielding of the or each signal conductor from the current conductors.

Opposite longitudinal sides and/or opposite transverse sides of the base body may have fixtures for securing and grounding the holding apparatus on a frame of the motor vehicle.

The holding apparatus permits effective shielding of the current conductors from the at least one signal conductor, specifically when the respective signal conductor runs at a relatively small distance from the current conductor. Shielded signal conductors can be dispensed with, and thus it is not necessary to ground a shield of shielded signal conductors.

The elements for guiding and fixing the current conductors may be positioned along the opposite longitudinal sides of the plate-like base body. The sections for securing and grounding the holding apparatus to the frame of the motor vehicle may be positioned along the opposite transverse sides of the plate-like base body. The elements for guiding and fixing the at least one signal conductor may extend parallel to the longitudinal sides of the plate-like base body. This configuration of the holding apparatus guides the current conductors and the at least one signal conductor well while providing reliable shielding of the respective signal conductor from the current conductors using simple means.

Exemplary embodiments of the invention will be explained in greater detail using the drawing, without being restricted thereto.

DETAILED DESCRIPTION

Figure 1:
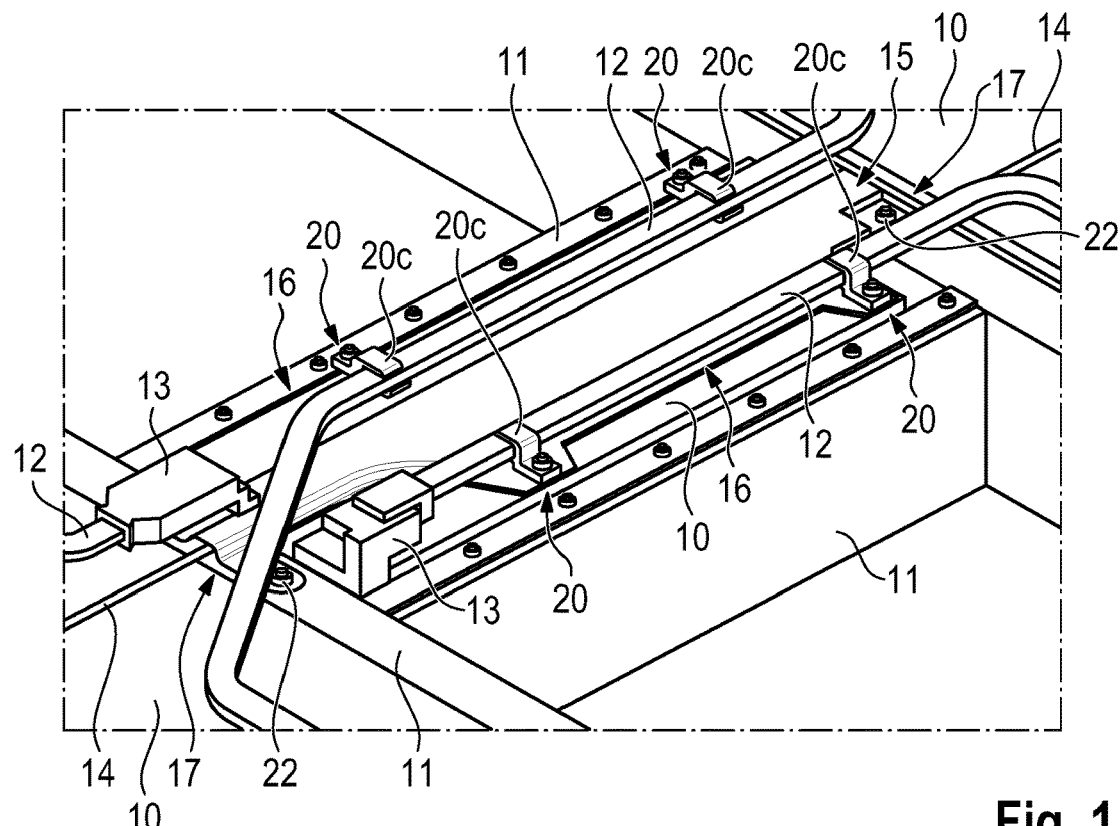
FIG. 1 is a perspective view of a holding apparatus according to the invention for current and signal conductors of a traction battery of a motor vehicle.

FIG. 1 shows a section of a body structure of an electric vehicle or hybrid vehicle in the region of a traction battery. Battery modules 10 of the traction battery are shown in FIG. 1. The battery modules 10 are positioned in a battery housing of the traction battery, and the battery housing is a constituent part of a frame of the motor vehicle. Thus, FIG. 1 shows struts 11 that are a constituent part of the frame of the motor vehicle, and therefore of the battery housing, and form corresponding receiving spaces for the battery modules 10. In this case, battery modules 10 are positioned in a front region of the motor vehicle and a rear region of the motor vehicle. A battery module 10 that is to be interconnected electrically and in terms of signal to the other battery modules 10 is arranged between the battery modules 10 positioned in the front and rear parts of the motor vehicle. Each battery module 10 has a module housing 10a and battery cells 10b.

Figure 2:
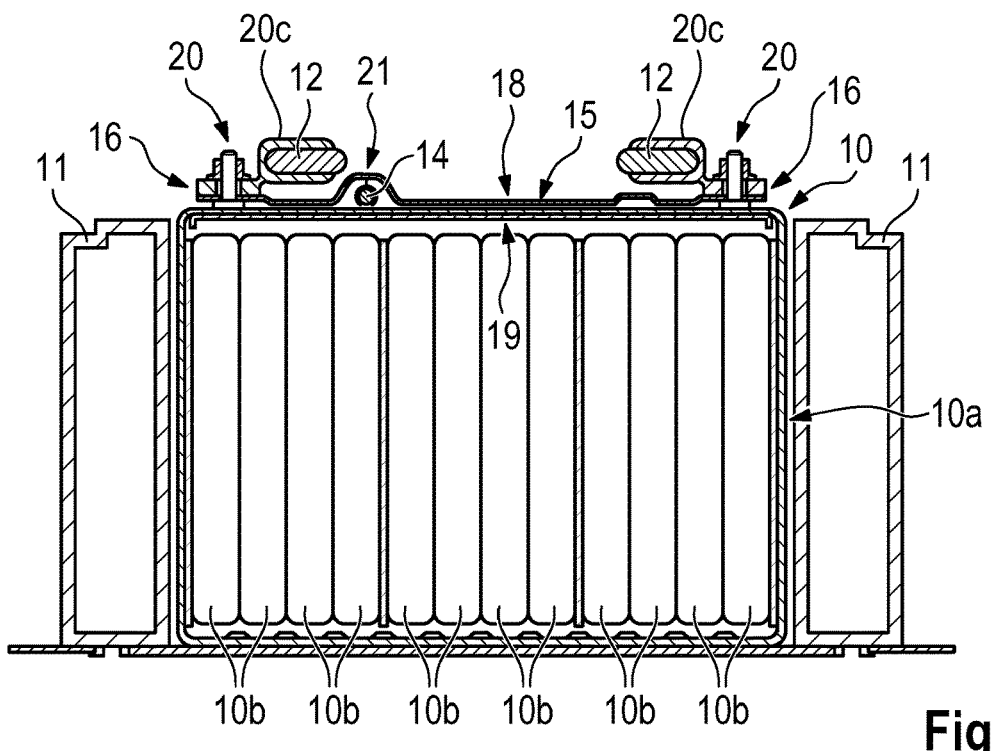
FIG. 2 is a cross section through FIG. 1.

FIGS. 1 and 2 show current conductors 12 that electrically interconnect the battery modules 10 to form a series circuit between the battery modules 10. In FIG. 1, a first current conductor 12 is connected by a connection 13 to a first connection contact of a battery module 10, a further electrical current conductor 12 is coupled by a connection 13 to a second connection contact of the battery module 10. FIG. 1 also shows a third current conductor 12 that extends over the battery module 10 to which the two other current conductors 12 are connected by way of their connections 13.

FIGS. 1 and 2 also show a signal conductor 14 that functions to transmit data signals or communication signals between the battery modules 10 or between the battery modules and a control device.

Figure 3:
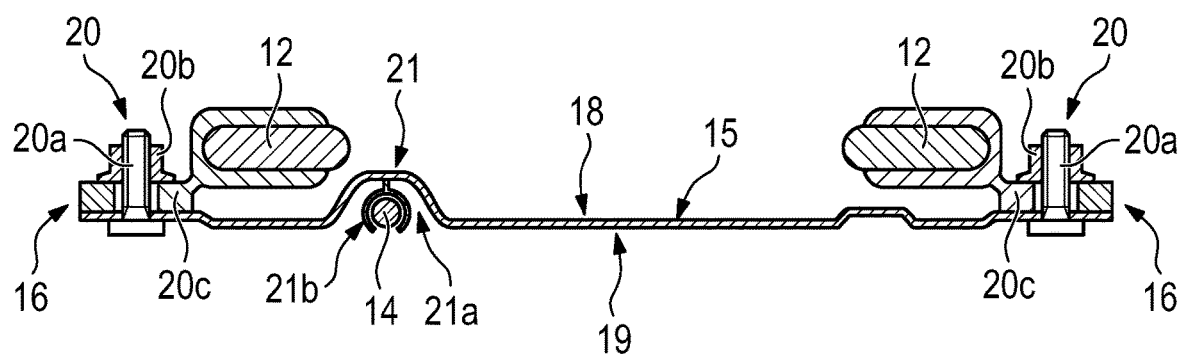
FIG. 3 shows a detail of FIG. 2.

FIGS. 1 and 2 show a holding apparatus 15 positioned above the battery module 10 and FIG. 3 is a cross section of the holding apparatus 15 with the current conductors 12 and the signal conductor 14, but without the battery module 10.

The holding apparatus 15 has a plate-like base body having longitudinal sides 16 and transverse ends 17. A top 18 and a bottom 19 of the plate-like base body 15 extends between the longitudinal sides 16 and the transverse ends 17.

In the illustrated embodiment, elements 20 for guiding and fixing the current conductors 12 are arranged on opposite longitudinal sides 16 of the top 18, but could be arranged on the bottom 19. These elements 20 for guiding and fixing the current conductors 19 comprise threaded bolts 20*a*, nuts 20*b* that interact with the threaded bolts 20*a*, and securing sections 20*c*. The securing sections 20*c* are configured to surround the respective current conductor 12 in sections.

The threaded bolts 20*a* extend through the securing sections 20*c* for the respective current conductor 12, and the nuts 20*b* fix the securing section 20*c* for the respective current conductor 12 to the corresponding threaded bolt 20*a*.

In the illustrated embodiment, the bottom side 19 of the base body 15 has elements 21 for guiding and fixing the signal conductor 14 so that the signal conductor 14 extends parallel to the longitudinal sides 16 of the plate-like base body 15. These elements 21 comprise a guide channel 21*a* formed in the base body 15 extending parallel to the longitudinal sides 16 of the base body 15 for guiding the respective signal conductor 14 and fixing clips 21*b* arranged in the guide channel 21*a* to hold the signal conductor 14 in the guide channel 21*a*. Plural fixing clips 21*b* are distributed along the longitudinal direction of the guide channel 21*a*.

The current conductors 12 extend parallel to the longitudinal sides 16 on the top 18 or bottom 19 of the holding apparatus 15, and the signal conductor 14 likewise extends parallel to the longitudinal sides 16 but farther in on the other of the top 18 and bottom 19 with respect to the holding apparatus or the plate-like base body 15.

In the illustrated embodiment, on both opposite transverse ends 17, in addition to the elements 20, 20*a*, 20*b* and 20*c*, which serve to guide and fix the current conductors 12, and the elements 21, 21*a*, 21*b*, which serve to guide and fix the respective signal conductor 14, the plate-like base body of the holding apparatus 15 has on the opposite longitudinal sides 16 and/or on the opposite transverse ends 17 sections 22 for securing and grounding the holding apparatus to the frame of the motor vehicle, namely to the struts 11 of the motor vehicle that are shown in FIG. 1. The holding apparatus 15 accordingly is grounded on both sides or ends at which the signal conductor 14 emerges from the guide channel 21*a*. By securing and grounding at both sides or ends, the functional reliability of the grounding is increased. If the respective section 22 for securing and grounding the holding apparatus should unintentionally be released at one side or end, the section 22 arranged at the other end still ensures securing and grounding of the holding apparatus.

The plate-like base body of the holding apparatus 15 is preferably metallic and therefore electrically conductive. The current conductors 12 are also metallic and therefore electrically conductive. In contrast, the securing sections 20*c* for the current conductors 12 are formed from an electrically non-conductive material.

The present invention accordingly provides a holding apparatus 15 for high-voltage current conductors 12 and low-voltage signal conductors 14 of a traction battery of a motor vehicle that functions to guide and fix the current conductors 12 preferably formed as busbars, to guide and fix the respective signal conductor 14 and to shield the signal conductor 14 from the current conductors 12 to provide EMC shielding for the respective signal conductor. The holding apparatus 15 according to the invention is of a simple design and permits effective shielding of the respective signal conductor 14.

What is claimed is:

1. A holding apparatus for current conductors and at least one signal conductor of a traction battery of a motor vehicle, comprising:

a plate-like base body with longitudinal sides and transverse ends and also a top surface and bottom surface extending between the longitudinal sides and transverse ends, the plate-like base body being formed from an electrically conductive metallic material;

current conductor fixing elements formed from an electrically non-conductive material and being arranged on the top surface of the plate-like base body and being configured for guiding and fixing current conductors of the traction battery at positions spaced above the plate-like base body;

at least one signal conductor fixing element arranged on the bottom surface of the plate-like base body, the signal conductor fixing element including a guide channel formed in the plate-like base body for guiding the at least one signal conductor and fixing clips arranged in the guide channel, the fixing clips being configured for fixing the at least one signal conductor of the traction battery, wherein the plate-like base body provides EMC shielding, and the plate-like base body has on the opposite longitudinal sides and/or on the opposite transverse ends sections for securing and grounding the holding apparatus on a frame of a motor vehicle.

2. The holding apparatus of claim 1, wherein the motor vehicle has a frame and a traction battery, and the frame forms a housing of the traction battery of the motor vehicle.

3. The holding apparatus of claim 1, wherein the current connector fixing elements are positioned along the opposite longitudinal sides of the plate-like base body.

4. The holding apparatus of claim 3, wherein the current conductor fixing elements for guiding and fixing the current conductors comprise apertures extending therethrough, and the holding apparatus further comprises threaded bolts that extend through the apertures of the respective current conductor fixing elements and through the plate-like base body to define securing points for securing the current conductor fixing elements relative to the base-like base body.

5. The holding apparatus of claim 4, wherein the threaded bolts interact with nuts to fix the respective current conductor to the respective threaded bolt.

6. The holding apparatus of claim 1, wherein the sections for securing and grounding the holding apparatus to the frame of the motor vehicle are positioned along the opposite transverse ends of the plate-like base body.

7. The holding apparatus of claim 1, wherein the guide channel of the at least one signal conductor fixing element extends parallel to the longitudinal sides of the plate-like base body.

8. The motor vehicle of claim 1, wherein the current conductor fixing elements comprise apertures extending therethrough, and the holding apparatus further comprises threaded bolts that extend through the apertures of the respective current conductor fixing elements and through the plate-like base body to define securing points for securing the current conductor fixing elements relative to the base-like base body.

9. A motor vehicle, comprising:
a traction battery having battery modules;
current conductors and at least one signal conductor connected to the traction battery; and
a holding apparatus for holding the current conductors and the at least one signal conductor in proximity to the traction battery, the holding apparatus comprising:
a plate-like base body with longitudinal sides and transverse ends and also a top surface and bottom surface extending between the longitudinal sides and transverse ends, the plate-like base body being formed from an electrically conductive metallic material;
current conductor fixing elements formed from an electrically non-conductive material and being arranged on the top surface of the plate-like base body and being configured for guiding and fixing current conductors of the traction battery at positions spaced above the plate-like base body;
at least one signal conductor fixing element arranged on the bottom surface of the plate-like base body, the signal conductor fixing element including a guide channel formed in the plate-like base body for guiding the at least one signal conductor and fixing clips arranged in the guide channel, the fixing clips being configured for fixing the at least one signal conductor of the traction battery, wherein
the plate-like base body provides EMC shielding of the at least one signal conductor from the current conductors, and
the plate-like base body has on the opposite longitudinal sides and/or on the opposite transverse ends sections for securing and grounding the holding apparatus on a frame of the motor vehicle.

10. The motor vehicle of claim 9, wherein the frame of the motor vehicle forms a housing of the traction battery of the motor vehicle.

* * * * *